(12) United States Patent
Muta

(10) Patent No.: US 8,440,565 B2
(45) Date of Patent: May 14, 2013

(54) SEMICONDUCTOR APPARATUS MANUFACTURING METHOD AND SEMICONDUCTOR APPARATUS

(75) Inventor: Tadayoshi Muta, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 612 days.

(21) Appl. No.: 12/620,660

(22) Filed: Nov. 18, 2009

(65) Prior Publication Data

US 2010/0127403 A1 May 27, 2010

(30) Foreign Application Priority Data

Nov. 26, 2008 (JP) ................................. 2008-301210

(51) Int. Cl.
*H01L 21/44* (2006.01)
(52) U.S. Cl.
USPC .................................... 438/667; 257/E21.597
(58) Field of Classification Search .................. 438/667; 257/E21.597
See application file for complete search history.

(56) References Cited

U.S. PATENT DOCUMENTS

| | | | | |
|---|---|---|---|---|
| 6,624,066 | B2* | 9/2003 | Lu et al. .......................... | 438/675 |
| 6,856,023 | B2 | 2/2005 | Muta et al. ..................... | 257/774 |
| 7,094,701 | B2 | 8/2006 | Umemoto et al. ............. | 438/706 |
| 7,646,100 | B2* | 1/2010 | Kameyama et al. .. | 257/E21.575 |
| 8,004,090 | B2* | 8/2011 | Uchiyama ............. | 257/E21.577 |
| 2002/0192976 | A1* | 12/2002 | Trapp et al. ..................... | 438/723 |
| 2003/0082356 | A1* | 5/2003 | Suemasu et al. .............. | 428/209 |
| 2006/0024966 | A1 | 2/2006 | Umemoto et al. ............. | 438/689 |
| 2006/0290002 | A1* | 12/2006 | Arana et al. .................... | 257/774 |
| 2007/0249163 | A1* | 10/2007 | Oikawa .......................... | 438/637 |
| 2009/0047781 | A1* | 2/2009 | Pratt et al. ...................... | 438/667 |
| 2011/0042803 | A1* | 2/2011 | Chu ............................... | 438/667 |

* cited by examiner

*Primary Examiner* — Matthew Landau
*Assistant Examiner* — Sun M Kim
(74) *Attorney, Agent, or Firm* — Fitzpatrick, Cella, Harper & Scinto

(57) ABSTRACT

There is provided a method of manufacturing the semiconductor apparatus, including: forming through-hole which penetrates a semiconductor substrate at a point that corresponds to a location of an electrode pad; forming an insulating film on a rear surface of the semiconductor substrate, including the interior of the through-hole; forming an adhesion securing layer from a metal or an inorganic insulator on a surface of the insulating film at least in an opening portion of the through-hole; forming a resist layer to serve as a mask in bottom etching on the adhesion securing layer; performing bottom etching to expose the electrode pad; removing the resist layer to obtain the insulating film free of surface irregularities that would otherwise have been created by bottom etching; forming a barrier layer, a seed layer, and a conductive layer by a low-temperature process; and performing patterning.

6 Claims, 5 Drawing Sheets

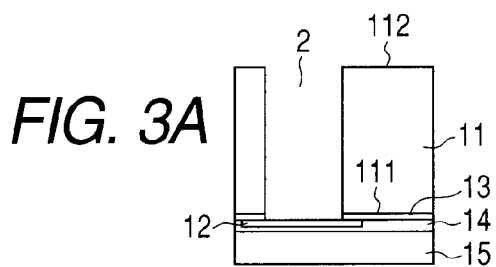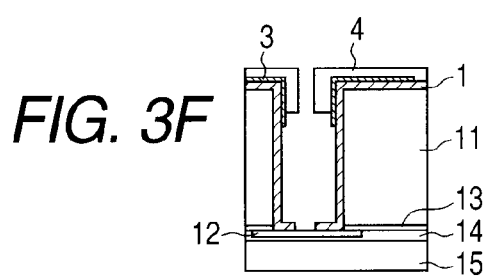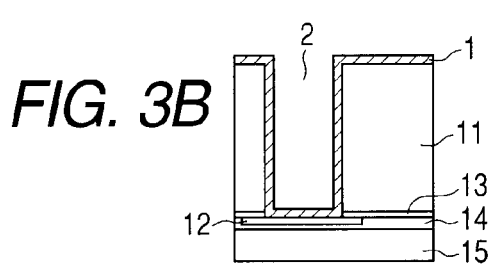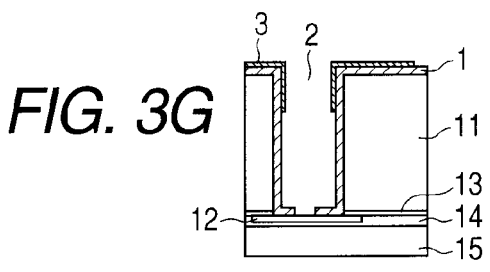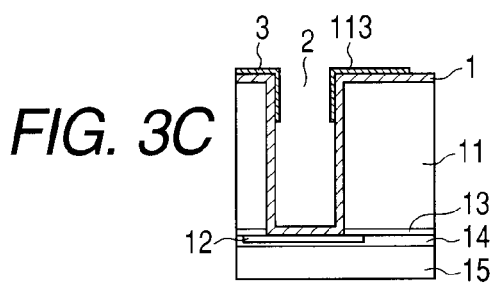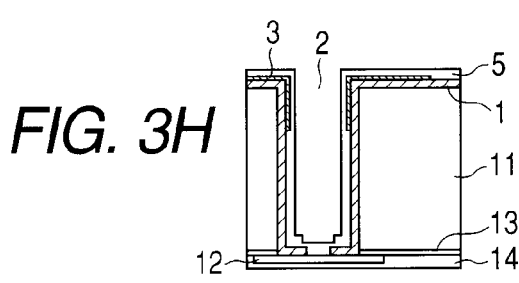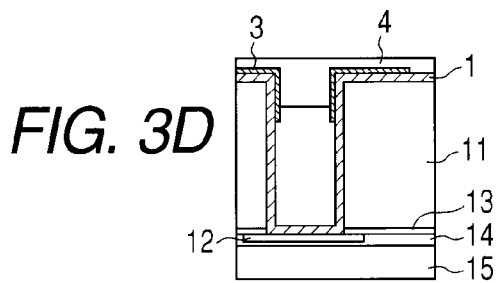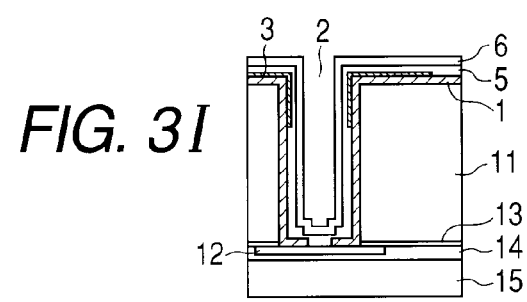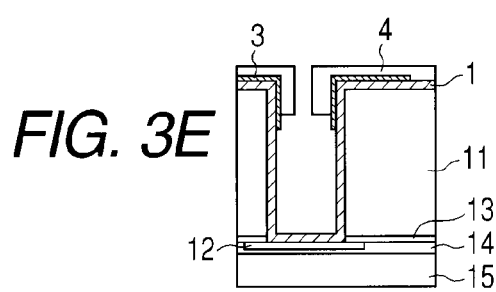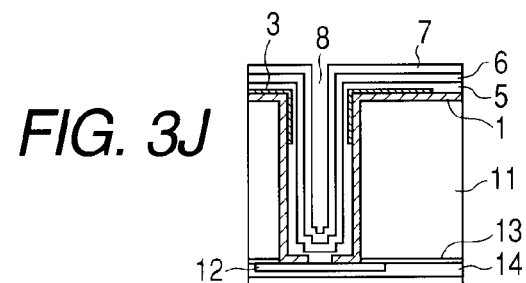

SEMICONDUCTOR APPARATUS MANUFACTURING METHOD AND SEMICONDUCTOR APPARATUS

BACKGROUND OF THE INVENTION

1. Field of the Invention

The present invention relates to a semiconductor apparatus manufacturing method and a semiconductor apparatus.

2. Description of the Related Art

The recent reduction in size and improvement in performance of electronic equipment have created a demand for a semiconductor apparatus that is smaller in size and higher in packaging density. Three-dimensional packaging is an effective measure of giving a semiconductor apparatus a smaller size and a higher packaging density. As one of the technologies that constitute the nucleus of three-dimensional packaging, the importance of penetrating electrode technology which is about an electrode connecting a front surface and a rear surface of a semiconductor substrate is increasing.

Raising the packaging density of the semiconductor apparatus with the use of penetrating electrode technology has been practiced. In those practices, wiring is formed on the rear surface of a semiconductor substrate to be connected on the rear surface of the semiconductor substrate to an external terminal, multiple semiconductor substrates prepared in this manner are stacked on top of one another, and the front and rear surfaces of each semiconductor substrate are electrically connected.

The needs for the semiconductor apparatus with a penetrating electrode are increasing in various fields including semiconductor chips for use in semiconductor memories, CMOS sensors, AF sensors, and other similar applications, semiconductor packages in which multiple semiconductor chips are stacked, and connectors for ink jet heads.

A conventional way to manufacture a penetrating electrode is as follows. First, a semiconductor substrate on which an electrode pad has been formed is prepared. Next, a mask pattern is formed on the rear surface of the semiconductor substrate to etch the semiconductor substrate so that a through-hole piercing the semiconductor substrate is formed. The through-hole runs from a point on the rear surface that corresponds to the location of the electrode pad to the front surface, exposing the electrode pad. An insulating film is then formed on the rear surface of the semiconductor substrate including the interior of the through-hole. Next, the insulating film at the bottom portion of the through hole is etched to expose the electrode pad and, after that, a conductive layer is formed. A penetrating electrode is thus manufactured.

With this manufacturing method, however, when the step of etching the insulating film at the bottom portion of the through-hole (bottom etching) employs, for example, reactive ion etching, electric field concentration occurs in the insulating film at the corners of the opening portion and bottom portion of the through-hole in the semiconductor substrate. The electric field concentration makes the density of the reactive ion at the corners higher than other portions. As a result, the insulating film at the corners of the opening portion and the bottom portion is etched at an accelerated rate, and could end up being very thin or completely etched away. In addition to the insulating film at the corners, the bottom etching described above tends to remove the insulating film on the inner wall of the through-hole more than necessary. An insulation failure sometimes occurs as a consequence between a penetrating electrode that is formed in the through-hole after the bottom etching and the semiconductor substrate.

A solution to this is proposed in U.S. Pat. No. 7,094,701. U.S. Pat. No. 7,094,701 discloses two methods. In one method, a reinforcement insulating film 16 is formed on an insulating film 10 so that an overhang portion 18 is created at a through-hole opening portion as illustrated in FIG. 7, and then bottom etching is performed to remove the insulating film 10 from a through-hole bottom portion and expose an electrode pad 22. In the other method, eaves are created from a hard mask 17 at a through-hole opening portion as illustrated in FIG. 8, and bottom etching is performed with the eaves as a mask to remove an insulating film 10 from a through-hole bottom portion and expose an electrode pad 22.

With the method that uses the reinforcement insulating film, the bottom etching step described above can expose the electrode pad 22 but leaves the protrusion of the reinforcement insulating film at the through-hole opening portion.

Further, the method that uses hard mask eaves has a similar problem in that the protrusion remains after the bottom etching.

The protrusions in the reinforcement insulating film method and the hard mask eaves method create surface irregularities in the insulating film on through-hole inner wall after the bottom etching, and the surface irregularities on the through-hole inner wall present obstacles that leave some spots bare of a barrier layer and a seed layer.

The resultant lowering in yield and reliability of the semiconductor apparatus has been an unsolved problem.

SUMMARY OF THE INVENTION

The prevent invention has been made in view of the above, and an object of the present invention is to provide a semiconductor apparatus with a penetrating electrode and a method of manufacturing the semiconductor apparatus with a penetrating electrode at high yield in which a highly reliable penetrating electrode structure is built by forming an insulating film that has no surface irregularities in bottom etching during a penetrating electrode forming step.

In order to attain the above-mentioned object, the present invention provides a method of manufacturing a semiconductor apparatus with an electrode pad and a semiconductor device formed on a front surface of a semiconductor substrate: including forming a through-hole that penetrates the semiconductor substrate and thereby exposing the electrode pad at a bottom portion of the through-hole, the through-hole having an opening portion on a rear surface of the semiconductor substrate opposite to the front surface of the semiconductor substrate at a point that corresponds to a location of the electrode pad formed on the front surface of the semiconductor substrate; forming an insulating film on the bottom portion of the through-hole and on an inner wall of the through-hole; forming an adhesion securing layer on a surface of the insulating film at least in the opening portion of the through-hole; forming a resist layer on a surface of the adhesion securing layer; etching the insulating film at the bottom portion of the through-hole with the resist layer as a mask, to thereby expose the electrode pad at the bottom portion of the through-hole; removing the resist layer to expose the adhesion securing layer; and forming a conductive layer on the bottom portion of the through-hole and on the inner wall of the through-hole, and bringing the conductive layer into contact with the electrode pad.

The present invention also provides a semiconductor apparatus including: an electrode pad formed on a front surface of a semiconductor substrate; a through-hole which has an opening portion on a rear surface of the semiconductor substrate that corresponds to a location of the electrode pad and which penetrates the semiconductor substrate; an insulating film formed at least on an inner wall of the through-hole; an adhesion securing layer formed on the insulating film and at least in an opening portion of the inner wall of the through-hole; and a conductive layer formed on the inner wall of the through-hole and a bottom portion of the through-hole, including an area above the adhesion securing layer in which the electrode pad is in contact with the conductive layer.

According to the present invention, a uniform insulating film having no surface irregularities is obtained. A uniform conductive layer is thus formed with ease.

The yield and reliability of the semiconductor apparatus are accordingly improved.

Further features of the present invention will become apparent from the following description of exemplary embodiments with reference to the attached drawings.

BRIEF DESCRIPTION OF THE DRAWINGS

FIGS. 3A, 3B, 3C, 3D, 3E, 3F, 3G, 3H, 3I, and 3J are sectional views illustrating the manufacturing method according to Embodiment 1 of the present invention.

DESCRIPTION OF THE EMBODIMENTS

A semiconductor apparatus manufacturing method according to the present invention is described below with reference to the drawings.

FIG. 2 and FIGS. 3A to 3J are diagrams illustrating a semiconductor apparatus manufacturing method according to Embodiment 1 of the present invention.

Figure 2:
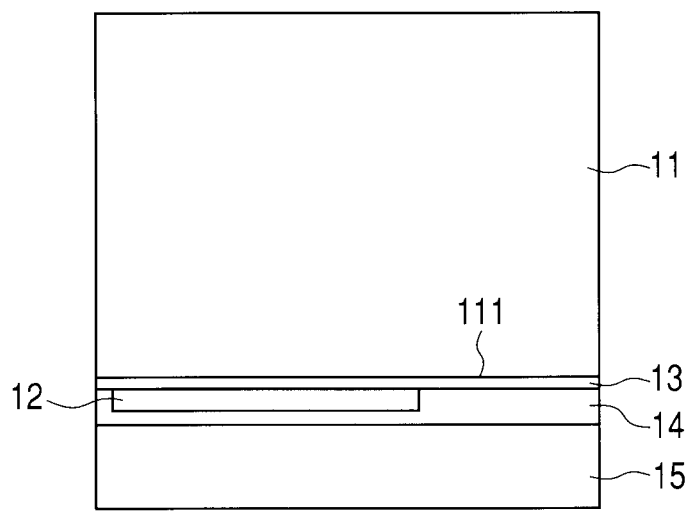
FIG. 2 is a sectional view illustrating the semiconductor substrate according to Embodiment 1 of the present invention.

First, a semiconductor substrate as the substrate illustrated in FIG. 2 is prepared. In FIG. 2, a semiconductor substrate 11 can be a substrate of which the main component is a single element such as silicon, germanium, or selenium, or a compound such as an oxide, a sulfide, a selenide, a telluride, an antimony compound, an arsenic compound, or a phosphorus compound.

An electrode pad 12 is formed in advance on a front surface 111 of the semiconductor substrate 11 (or on a surface of an interlayer insulating film 13 in the case where the semiconductor substrate 11 includes the interlayer insulating film 13 formed thereon). The electrode pad 12 is provided with a semiconductor device (not shown), which is installed with wiring interposed between the semiconductor device and the electrode pad 12. A supporting member 15 may be formed on the electrode pad 12 with a resin layer 14 interposed between the supporting member 15 and the electrode pad 12. The supporting member 15 may be removed in a later step, or may be left without any attempt for removal. In FIG. 2 and subsequent drawings, components that are identical to those in previous drawings are denoted by the same reference symbols, and descriptions on such components are omitted.

Next, a through-hole 2 is formed as illustrated in FIG. 3A. The through-hole 2 penetrates the semiconductor substrate 11 from the side of a rear surface 112 of the semiconductor substrate 11 that corresponds to the location of the electrode pad 12, which is formed on the front surface of the semiconductor substrate 11. The electrode pad 12 is thus exposed at the bottom portion of the through-hole 2. In other words, a through-hole having an opening on the rear surface 112, which is opposite from a surface of the semiconductor substrate 11 where the semiconductor device has been formed, is formed to penetrate the semiconductor substrate 11. The hole can be opened by, for example, ICP-RIE.

The next step is an insulating film forming step in which, as illustrated in FIG. 3B, an insulating film 1 is formed on the bottom portion and an inner wall of the through-hole 2. The insulating film 1 is also formed on the rear surface of the semiconductor substrate 11. The insulating film 1 here is preferred to be an organic insulating film formed by, for example, parylene deposition. The parylene film desirably has a thickness of about 1 µm to 3 µm. A more uniform insulating film can be formed by choosing such parylene deposition conditions that deposition lasts long in a low-pressure reaction chamber while avoiding an oversupply of a deposition material gas to the interior of the through-hole 2. The insulating film 1 may be formed from other materials than parylene, and polyimide resin, maleimide resin, polyamide resin, polyimide-amide resin, polyester resin, polyether resin, bisphenol resin, modified epoxy resin, modified acrylic resin, silicon resin, fluorocarbon resin, and melamine resin can be employed alone or in appropriate combination.

The next step is an adhesion securing layer forming step in which an adhesion securing layer 3 is formed on the insulating film 1 as illustrated in FIG. 3C. The adhesion securing layer 3 is a layer formed on the insulating film 1 in order to prevent processes that are performed in the subsequent steps from changing the adhesion between the insulating film 1 and a resist layer formed above the insulating film 1. Sputtering or ion coating is used to form the adhesion securing layer 3 on the insulating film 1, at least in a through-hole opening portion of the through-hole inner wall. The adhesion securing layer 3 may also be formed on the rear surface of the semiconductor substrate 11. The thickness of the adhesion securing layer 3 is desirably 0.01 µm to 0.1 µm. If the adhesion securing layer 3 is thinner than 0.01 µm, a resist mask formed in the next step leaves a residue, and/or the insulating film 1 is damaged, upon removal of the resist mask. If the adhesion securing layer 3 is thicker than 0.1 µm, resultant surface irregularities on the inner wall of the through-hole 2 present obstacles, which could leave some spots bare of a conductive layer (e.g., a barrier layer and a seed layer) formed in a later step. The adhesion securing layer 3 is preferred to be formed from a metal that forms a close contact with the insulating film 1, for example, titanium, tungsten, or chromium. The through-hole opening portion of the through-hole inner wall where the adhesion securing layer 3 is formed on the insulating film 1 stretches 1 mm or more from opening portion edges 113. In other words, the extent of the through-hole opening portion should be large enough to allow the resist layer formed in the next step to sit on the adhesion securing layer 3. If the adhesion securing layer 3 stretches less than 1 mm from the opening portion edges 113, it is difficult to form the resist layer in the opening portion. The adhesion securing layer 3 which is formed at least in the through-hole opening portion of the through hole inner wall may not be formed in an area from which the insulating film 1 at a through-hole bottom portion would be removed (bottom etching area). If formed in the area from which the insulating film 1 at the through-hole bottom portion is removed, the adhesion securing layer 3 may make the removal of the insulating film 1 difficult. In other areas than the area from which the insulating film 1 at the through-hole bottom portion is removed, the presence of the adhesion securing layer 3 does not cause a problem.

The next step is a resist mask forming step in which, as illustrated in FIG. 3D, a resist layer 4 is formed on a surface of the adhesion securing layer 3 to form a mask that covers the opening portion of the through-hole 2 and fills a space above the through-hole opening portion. The resist layer 4 is formed by, for example, dry film lamination (TOK: AOR 320) or spray coating.

The next step is a resist mask patterning step in which the resist layer 4 is patterned to form an opening as illustrated in FIG. 3E. The diameter of the opening is smaller than the opening diameter of the through-hole 2.

The next step is a bottom etching step in which, as illustrated in FIG. 3F, the insulating film 1 at the through-hole bottom portion is etched with the resist layer 4 as a mask (so-called bottom etching). Using the resist layer 4 as a mask prevents the accelerated etching of the insulating film 1 at corners of the opening portion and the bottom portion which would make the insulating film 1 at the corners very thin or remove the insulating film 1 at the corners completely. In addition to the insulating film at the corners, the use of the mask also prevents the bottom etching described above from removing the insulating film 1 on the through-hole inner wall more than necessary.

The bottom etching is preferred to be reactive ion etching, but other etching processes may be employed. The bottom etching exposes a surface of the electrode pad 12 at the through-hole bottom portion.

Figure 6:
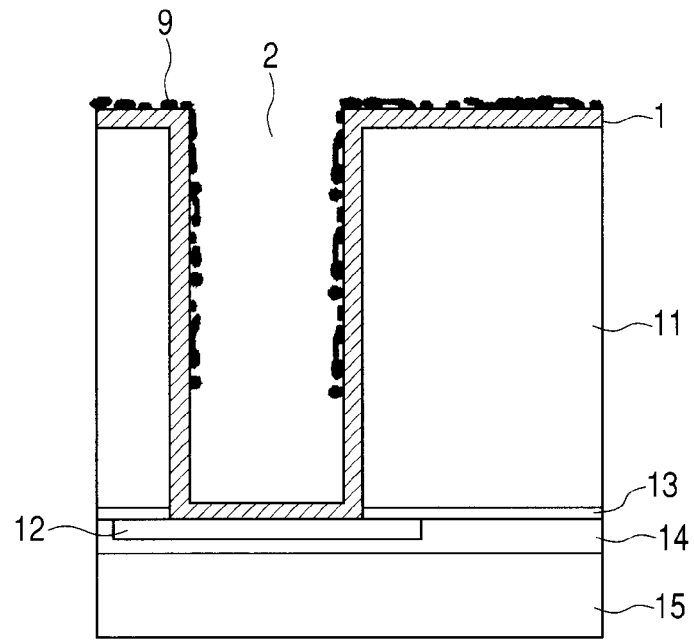
FIG. 6 is a sectional view illustrating a semiconductor apparatus and a manufacturing method therefor according to a prior art example.
Figure 7:
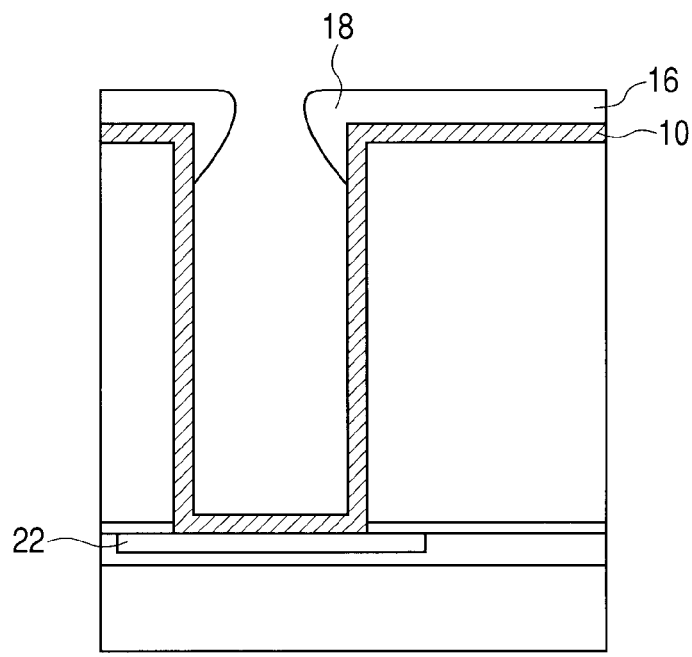
FIG. 7 is a sectional view illustrating the semiconductor apparatus and the manufacturing method therefor according to the prior art example.
Figure 8:
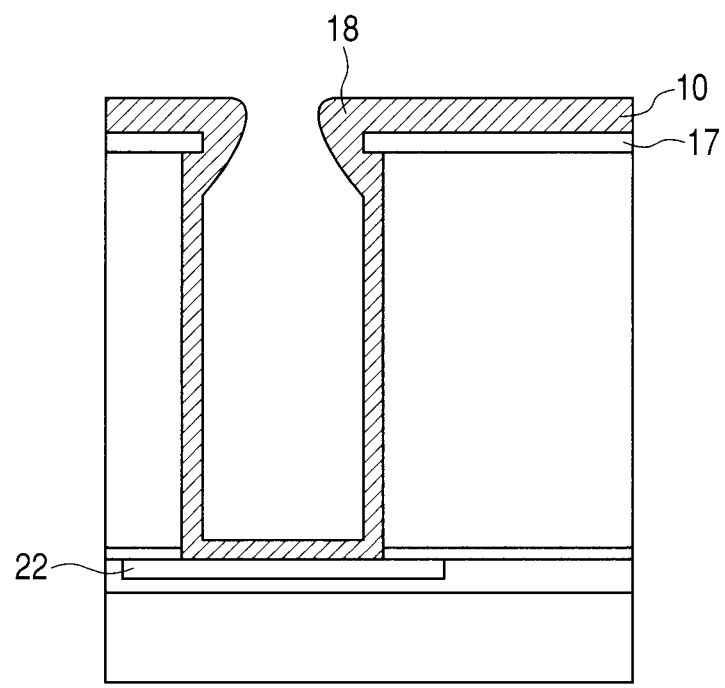
FIG. 8 is a sectional view illustrating the semiconductor apparatus and the manufacturing method therefor according to the prior art example.

The next step is a resist removal step in which the resist layer 4 is removed as illustrated in FIG. 3G. By removing the resist layer 4, the insulating film 1 having no surface irregularities is formed on the inner wall of the through-hole 2. Forming the resist layer 4 on the surface of the adhesion securing layer 3 ensures a clean removal of the resist layer 4. If the resist layer 4 is formed and the bottom etching is performed without providing the adhesion securing layer 3, the resist layer 4 is burned into the insulating film 1 and fails to be removed. The unsuccessful removal leaves resist layer residues 9 as illustrated in FIG. 6, and creates surface irregularities on the surface of the insulating film 1.

Next, a conductive layer is formed on the through-hole inner wall where the adhesion securing layer 3 is formed and the through-hole bottom portion. Specifically, a conductive layer is formed on the electrode pad 12 exposed at the through-hole bottom portion, on the insulating film 1, and on the adhesion securing layer 3. The conductive layer formation includes, for example, a barrier layer forming step, a seed layer forming step, and a plating step.

First, in the barrier layer forming step illustrated in FIG. 3H, a barrier layer 5 is formed on the electrode pad 12, the insulating film 1, and the adhesion securing layer 3, on the rear surface of the semiconductor substrate 11, including the interior of the through-hole 2.

The barrier layer 5 is a layer formed from a metal such as titanium, chromium, tungsten, titanium tungsten (TiW), titanium nitride (TiN), or tantalum nitride (TaN).

Next, in the seed layer forming step, a seed layer 6 is formed on the barrier layer 5 as illustrated in FIG. 3I. The seed layer 6 serves as an electrode for forming a plating layer 7, which is described later, and is formed from a metal such as gold. The barrier layer 5 and the seed layer 6 are formed by, for example, low-temperature ion coating that is performed at high vacuum level.

Next, in the plating step illustrated in FIG. 3J, the plating layer 7 is formed from, for example, gold by, for example, electrolytic plating on the barrier layer 5 and the seed layer 6, including the interior of the through-hole 2.

The thickness of the plating layer 7 is adjusted to 2 μm. The conductive layer is thus brought into contact with the electrode pad 12. In other words, a penetrating electrode 8 is electrically connected via the barrier layer 5, the seed layer 6, and the plating layer 7 to the electrode pad 12 exposed at the bottom portion of the through-hole 2.

Next, unnecessary portions of the plating layer 7, the seed layer 6, the barrier layer 5, and the adhesion securing layer 3 are etched by, for example, tint etching with the use of, for example, a dry film (TOK: AOR 320), to thereby complete a pattern.

If necessary, a gold bump or a similar member may be formed by plating or other methods prior to this process.

Lastly, a normal dicer is used to cut pieces of the semiconductor apparatus out of a wafer by dicing. The semiconductor apparatus is thus completed.

The semiconductor apparatus that is created by the semiconductor apparatus manufacturing method described above is described next with reference to the drawings.

(Embodiment 1)

Figure 1:
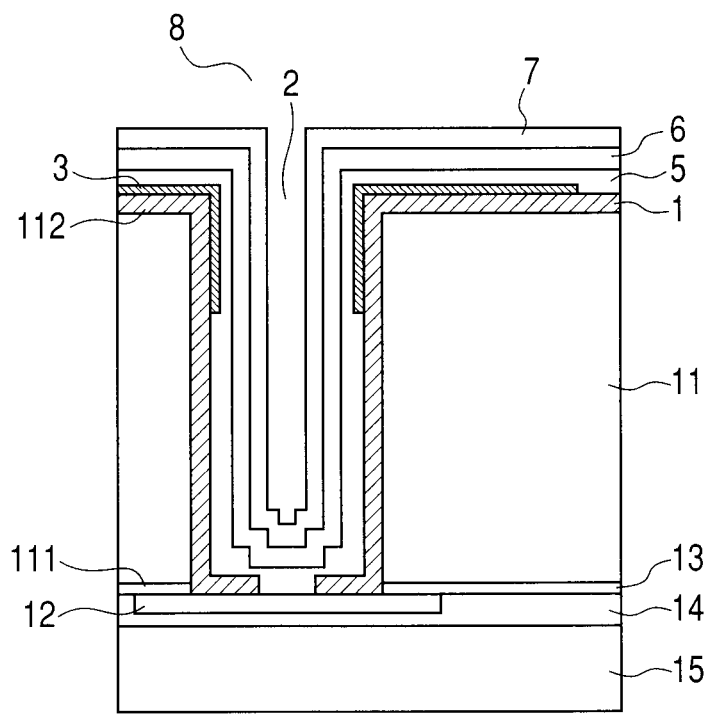
FIG. 1 is a sectional view illustrating a semiconductor apparatus and a manufacturing method according to Embodiment 1 of the present invention.

FIG. 1 is a diagram illustrating a semiconductor apparatus in section according to an embodiment of the present invention. The semiconductor apparatus of the present invention includes the penetrating electrode 8. The electrode pad 12 is formed on the front surface 111 of the semiconductor substrate 11 (or on a surface of the interlayer insulating film 13 in the case where the semiconductor substrate 11 includes the interlayer insulating film 13 formed thereon). The thickness of the semiconductor substrate 11 is 200 μm, for example. The interlayer insulating film 13 is formed by the lamination of $SiO_2$ and SiN in the semiconductor process, for example. Further, components including a semiconductor device (not shown) and wiring (not shown) are connected to the electrode pad 12. The electrode pad 12 has a thickness of, for example, 2.1 μm and the wiring has a thickness of, for example, 0.6 μm. The through-hole 2 with a diameter of, for example, 50 μm is formed in the semiconductor substrate 11 at a point that corresponds to the location of the electrode pad 12. The aspect ratio of the through-hole 2 is approximately 4, for example. The insulating film 1 is formed in the interior of the through-hole 2, except for a part of the bottom portion of the through-hole 2, and on the rear surface of the semiconductor substrate 11. The insulating film 1 is preferred to be an organic insulating film formed by, for example, parylene deposition. The parylene film desirably has a thickness of about 1 μm to 3 μm. The insulating film 1 may be formed from other materials than parylene, and polyimide resin, maleimide resin, polyamide resin, polyimide-amide resin, polyester resin, polyether resin, bisphenol resin, modified epoxy resin, modified acrylic resin, silicon resin, fluorocarbon resin, and melamine resin can be employed alone or in appropriate combination. The adhesion securing layer 3 is formed at least on the insulating film 1 that is along the edges of the through-hole opening portion and on the insulating film 1 that is on the rear surface of the semiconductor substrate 11. The thickness of the adhesion securing layer 3 is preferred to be 0.01 μm to 0.1 μm. If the adhesion securing layer 3 is thinner than 0.01 µm, a resist mask leaves a residue, and/or the insulating film 1 is damaged, upon removal of the resist mask. If the adhesion securing layer 3 is thicker than 0.1 µm, resultant surface irregularities on the through-hole inner wall present obstacles, which could leave some spots bare of the barrier layer and the seed layer. The adhesion securing layer 3 is preferred to be formed from a metal that forms a close contact with the insulating film 1, for example, titanium, tungsten, or chromium.

Next, the conductive layer is formed on the insulating film 1 and the adhesion securing layer 3. The conductive layer includes, for example, the barrier layer 5, the seed layer 6, and the plating layer 7. The barrier layer 5 is a layer formed from a metal such as titanium, chromium, tungsten, titanium tungsten (TiW), titanium nitride (TiN), or tantalum nitride (TaN). The seed layer 6 is formed from a metal such as gold. The plating layer 7 is formed from a metal such as gold. The thickness of the plating layer 7 is 2 µm, for example. The conductive layer is in contact with the electrode pad 12 at the through-hole bottom portion. In other words, an electrical contact with the electrode pad 12 exposed at the bottom portion of the through-hole 2 is established via the conductive layer. If necessary, a gold bump (not shown) or a similar member may be formed on the rear surface of the semiconductor substrate 11.

(Embodiment 2)

Embodiment 2 of the present invention is described next. In Embodiment 2, the adhesion securing layer 3 is formed from an inorganic insulating film.

Figure 4:
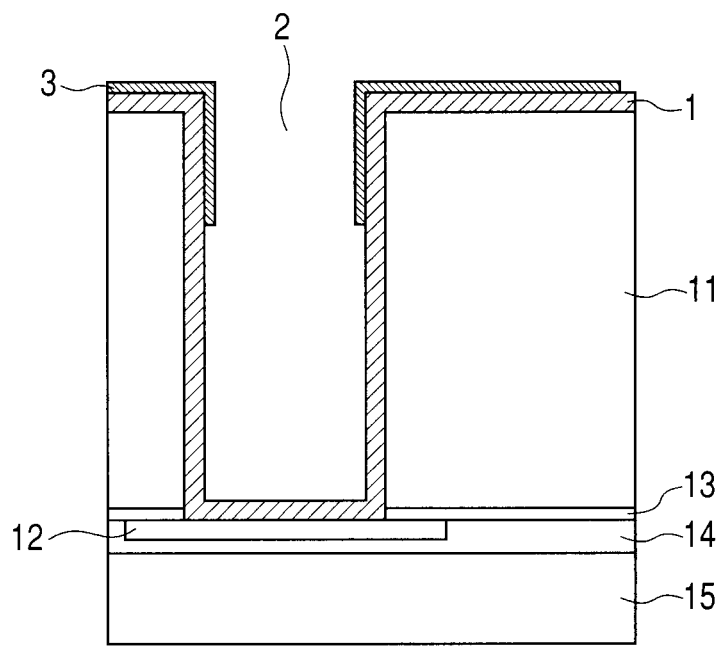
FIG. 4 is a sectional view illustrating a manufacturing method (formation of adhesion securing layer) according to Embodiment 2 of the present invention.

As illustrated in FIG. 4, sputtering or ECR is used to form an inorganic insulating film as the adhesion securing layer 3 along the opening portion edges of the through-hole 2 and on the entire rear surface of the semiconductor substrate 11. The adhesion securing layer 3 is formed from an inorganic insulator such as $SiO_2$ or SiN. After the adhesion securing layer is formed, the same steps as in Embodiment 1 are executed.

Figure 5:
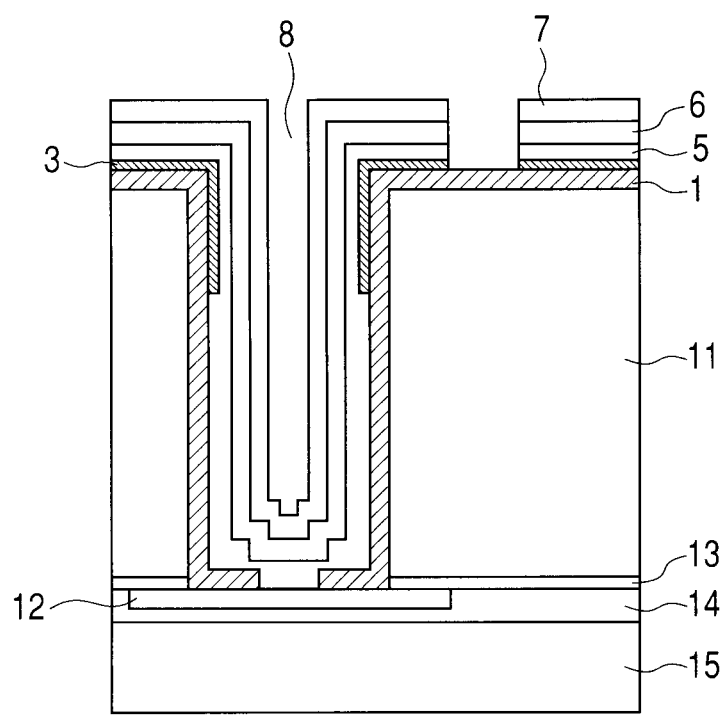
FIG. 5 is a sectional view illustrating a semiconductor apparatus and a manufacturing method therefor according to Embodiment 2 of the present invention.

In a step illustrated in FIG. 5, unnecessary portions of the barrier layer 5 and the seed layer 6 are etched away by tint etching with the use of a dry film.

The adhesion securing layer 3 which is an inorganic insulating film may be left intact in this step instead of being etched.

Lastly, a normal dicer is used to cut pieces of the semiconductor apparatus out of a wafer by dicing as in Embodiment 1. The semiconductor apparatus is thus completed.

Embodiment 1 is a case where the adhesion securing layer 3 is formed from a metal.

Embodiment 2 is a case where the adhesion securing layer 3 is formed from an inorganic insulator.

In the case where a metal is used for the adhesion securing layer 3, when a superficial layer of the adhesion securing layer 3 is to be removed in patterning or other processes, the superficial layer is easily removed by a process used to etch the barrier layer 5, the seed layer 6 and the plating layer 7.

When formed from an inorganic insulator, the adhesion securing layer 3 may be left on the surface if necessary.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-301210, filed Nov. 26, 2008, which is hereby incorporated by reference herein in its entirety.

What is claimed is:

1. A method of manufacturing a semiconductor apparatus with an electrode pad and a semiconductor device formed on a surface of a semiconductor substrate, comprising:
    forming a through-hole that penetrates the semiconductor substrate and thereby exposing the electrode pad at a bottom portion of the through-hole;
    forming an insulating film on the bottom portion of the through-hole and on an inner wall of the through-hole;
    forming an adhesion securing layer on the inner wall on which the insulating film has been formed;
    forming a resist layer on the inner wall on which the adhesion securing layer has been formed;
    etching the insulating film at the bottom portion of the through-hole with the resist layer as a mask, to thereby expose the electrode pad at the bottom portion of the through-hole;
    removing the resist layer to expose the adhesion securing layer; and
    forming a conductive layer on the bottom portion of the through-hole and on the inner wall of the through-hole, the inner wall having the exposed adhesion securing layer by removing the resist layer, and bringing the conductive layer into contact with the electrode pad,
    wherein the insulating film is formed of a material selected from the group consisting of parylene, polyimide resin, maleimide resin, polyamide resin, polyimide-amide resin, polyester resin, polyether resin, bisphenol resin, modified epoxy resin, modified acrylic resin, silicon resin, fluorocarbon resin, and melamine resin.

2. The method of manufacturing a semiconductor apparatus according to claim 1, wherein the adhesion securing layer comprises a metal or an inorganic insulator.

3. The method of manufacturing a semiconductor apparatus according to claim 1, wherein the adhesion securing layer comprises titanium, tungsten or chromium.

4. The method of manufacturing a semiconductor apparatus according to claim 1, wherein the adhesion securing layer is formed at a thickness of 0.01 µm or more to 0.1 µm or less.

5. The method of manufacturing a semiconductor apparatus according to claim 1, wherein the adhesion securing layer is formed by a sputtering method or an ECR method.

6. The method of manufacturing a semiconductor apparatus according to claim 1, wherein the adhesion securing layer is formed on an opening portion of the inner wall of the through-hole.

* * * * *